US006943635B1

United States Patent
Kaltenecker

(10) Patent No.: US 6,943,635 B1
(45) Date of Patent: Sep. 13, 2005

(54) OPTIMUM RF VCO STRUCTURE

(75) Inventor: Robert S. Kaltenecker, Westford, MA (US)

(73) Assignee: Conexant Systems, Inc., Newport Beach, CA (US)

( * ) Notice: Subject to any disclaimer, the term of this patent is extended or adjusted under 35 U.S.C. 154(b) by 112 days.

(21) Appl. No.: 10/676,803

(22) Filed: Sep. 30, 2003

(51) Int. Cl.[7] ............................................. H03B 5/12
(52) U.S. Cl. ...................... 331/108 D; 331/117 R; 331/177 V; 331/179; 331/187
(58) Field of Search .................... 331/108 C, 108 D, 331/117 R, 117 FE, 117 D, 177 V, 179, 187

(56) References Cited

FOREIGN PATENT DOCUMENTS

JP           2002-299986    * 10/2002

* cited by examiner

Primary Examiner—David Mis
(74) Attorney, Agent, or Firm—The Eclipse Group

(57) ABSTRACT

A voltage-controlled oscillator (VCO) formed upon a substrate with a first inductor being offset from a second inductor in one of three dimensions and forming a common area that may contain at least one of a varactor, capacitor, oscillator, or switch.

21 Claims, 8 Drawing Sheets

OPTIMUM RF VCO STRUCTURE

BACKGROUND OF THE INVENTION

1. Field of the Invention

This invention relates generally to voltage-controlled oscillators, and more particularly to voltage-controlled oscillators formed in semiconductor material.

2. Related Art

Fixed frequency oscillators are typically devices formed out of semiconductor materials that generate an oscillating voltage in response to a direct current (DC) voltage being applied. Oscillators are often used as clocks in digital applications such as computers and signal sources in Radio Frequency (RF) applications such as cellular telephones. It is also known that combining a frequency selective network and an active device to sustain oscillation forms a fixed frequency oscillator. Turning to FIG. 1, a schematic diagram of a known fixed frequency oscillator 100 is illustrated. The schematic diagram 100 shows a frequency selective network 102 in electrical communication with an active device 104. The frequency selective network 102 may be implemented with a capacitor 106 placed in parallel with an inductor 108. The active device 104 may be represented by a negative resistor 110 connected in parallel with another capacitor 112 and functions to sustain the voltage oscillation by offsetting the losses associated with the frequency selective network.

It is also known that an oscillator may be created that responds to changes in voltage. A change in voltage results in a corresponding change in the oscillation frequency of the oscillator. Such an oscillator is commonly referred to as a voltage-controlled oscillator (VCO). In FIG. 2, a schematic diagram of a known VCO 200 is illustrated. The schematic diagram 200 shows a variable frequency selective network 202 in electrical communication with an active device 204. The variable frequency selective network 202 may have a voltage variable capacitor, commonly referred to as a varactor 206 in parallel with an inductor 208. The varactor 206 may be implemented in an integrated circuit as a reverse biased diode that exhibits a capacitance that varies with applied DC voltage. A typical varactor in a semiconductor may exhibit a capacitance change of fifty percent. The varactor capacitance change combined with the other fixed capacitances in the frequency selective network 202 may result in a ten to twenty percent change in VCO frequency. The active device 204 may be represented by a capacitor 210 in parallel with a negative resistor 212 that sustains the oscillation by offsetting the losses associated with the frequency selective network 202.

Typical single VCOs formed in a semiconductor material have a frequency selective network that determines the frequency range of the single VCO. Further, the single VCOs constructed using varactors are typically narrowband devices with a tuning range of ten to twenty percent. The tuning range is represented by the formula: $F_{max}=1.1\ F_{min}$ or $F_{max}=1.2\ F_{min}$. Many RF communication applications, however, require wider frequency range coverage with an $F_{max}$ greater than $2\ F_{min}$.

A common approach to attaining an $F_{max}$ of $2\ F_{min}$ or more range coverage involves adding additional VCOs. But such an approach requires additional area on a semiconductor wafer. The additional area translates to additional cost and interconnections which degrade the VCO performance due to parasitic effects. Another known approach is to add band-shifting capability to a single VCO as shown in FIG. 3 and FIG. 4.

In FIG. 3, a circuit diagram 300 of a known frequency selective network 300 is illustrated. In FIG. 3, the frequency selective network 300 has a varactor 302 in parallel with inductor 304. An additional capacitor 306 may be connected in parallel with varactor 302 by switch 308 being closed. Further, an additional capacitor 310 may be connected in parallel with capacitor 306 and varactor 302 by switch 312 being closed in addition to switch 308 being in the closed position. The additional capacitance that is switched into the frequency selective network 300 shifts the tuning range of the circuit. Such an approach may occur in a MOSFET implementation. The drawbacks with such an implementation include the current losses that occur due to interconnections between capacitors/switches, the additional current loss caused by the switches or capacitors, and the increase in area that is required in a semiconductor chip having such an implementation.

In FIG. 4, a known frequency selective network 400 is illustrated. The frequency selective network 400 has a varactor 402 connected to an inductor 404. An additional inductor 406 is switched into the circuit in parallel with varactor 402 by switch 408. Yet another inductor 410 may be switched into the circuit in parallel with the varactor 402 and inductor 406 by switch 412. The additional inductance that is switched into the frequency selective network 400 results in the shifting of the tuning range of the circuit. The drawbacks with this implementation is the losses that occur due to interconnects between inductors/switches, the current losses within the switches and the additional inductors, as well as the increased space requirements on a semiconductor chip that incorporates such a VCO.

The frequency selective networks as shown in FIG. 4 may be implemented in semiconductor material such as CMOS, GaAs and BiCMOS. Traditional implementations of multiple inductors in semiconductor material place the inductors next to each other and then locate the additional VCO's electronic circuitry around the outside of the inductors. Such arrangements require separate space around each individual inductor and the additional VCO circuitry of switches and capacitors that enable band shifting. Known layouts of VCO circuitry in semiconductor material also require a number of interconnections between the electronic circuitry that is spread out around the outside of the inductors.

FIG. 5 illustrates a known VCO semiconductor layout 500 implementing the circuit of FIG. 4. The semiconductor layout 500 has a plurality of inductors 502, 504, 506, 508, 510, 512, 514, 516, 518, 520, 522, and 524. The inductors 514 and 516 have more metal than inductors 510 and 512. This is because when inductors are connected in parallel the resultant inductance is given by the equation:

$$L_T = \frac{L_1 L_2}{L_1 + L_2}$$

where $L_T$ is the total inductance of $L_1$ and $L_2$ in parallel. Thus when $L_1=3H$ and $L_2=3H$, $L_T=3/2H$. The total inductance always decreases when inductors are connected in parallel, the amount being dependent on the individual inductance values. The additional electrical circuitry may be seen around the outside of inductors 502, 504, 506, 508, 510, 512, 514, 516, 518, 520, 522, and 524.

Therefore, there is a need for methods and systems for increasing the tuning range of a VCO that overcomes the disadvantages set forth above and others previously described.

SUMMARY

Systems and methods consistent with the present invention provide an optimal VCO implemention in a semiconductor that reduces the area required on the semiconductor for the VCO while reducing the number of interconnections and increasing the VCO's tuning range. At least two inductors are formed on the semiconductor material with one being formed offset in at least one of three dimensions from the other and both inductors having a common area enclosed by the at least two inductors. The common space within the at least two inductors is used for at least one electrical component.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION

Figure 1:
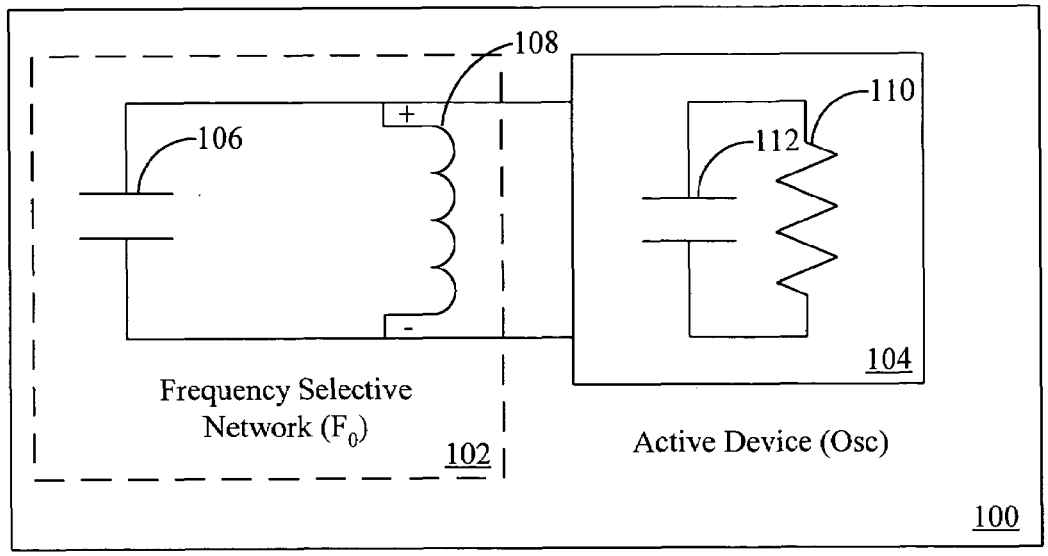
FIG. 1 illustrates a schematic diagram of a known fixed frequency oscillator 100.
Figure 2:
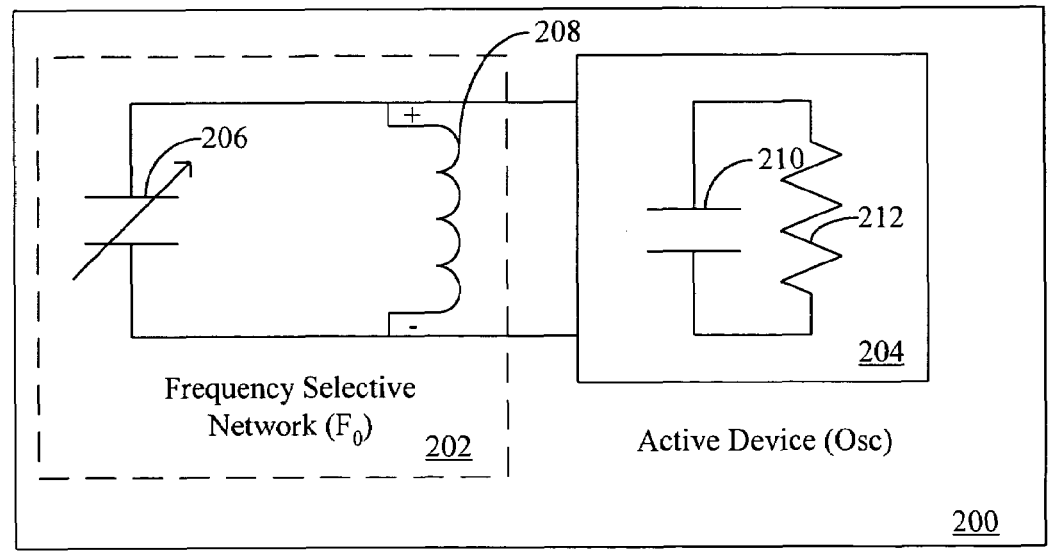
FIG. 2 illustrates a schematic diagram of a known VCO 200.
Figure 3:
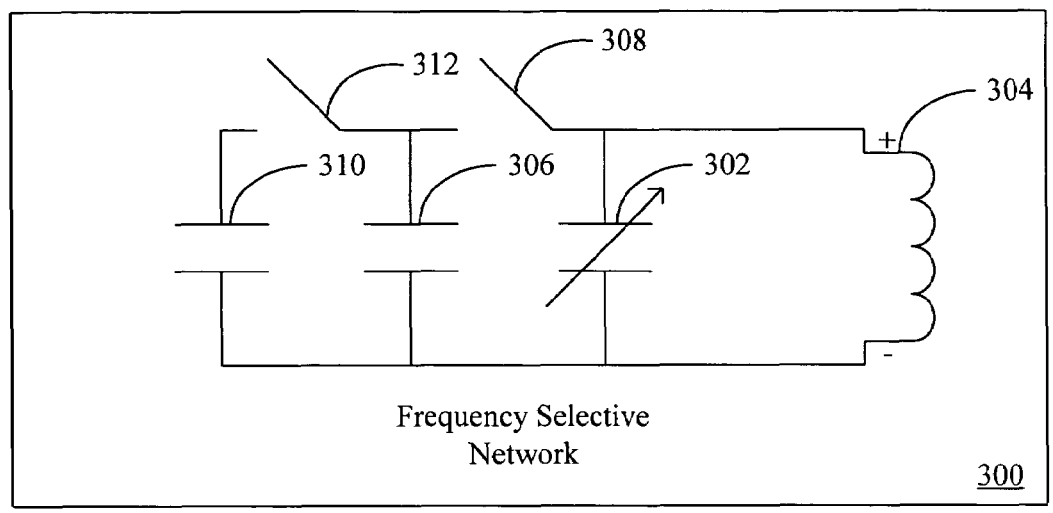
FIG. 3 illustrates a circuit diagram of a known frequency selective network 300.
Figure 4:
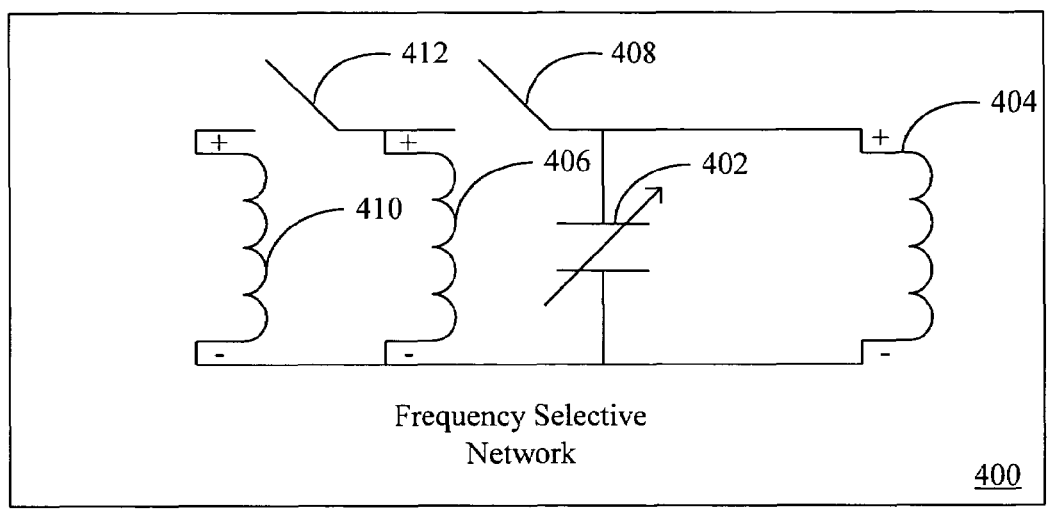
FIG. 4 illustrates a circuit diagram of a known frequency selective network 400.
Figure 5:
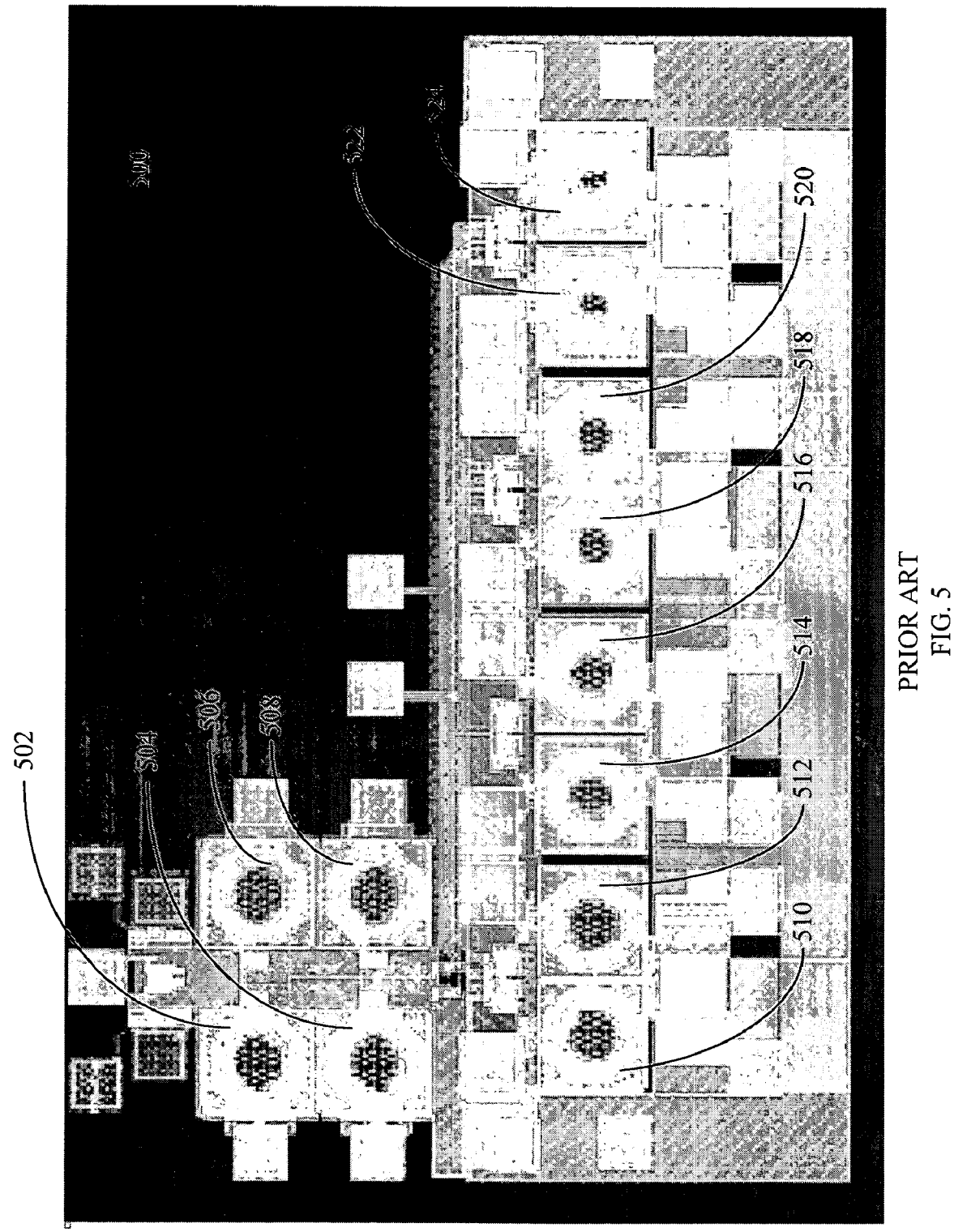
FIG. 5 illustrates a known VCO semiconductor layout 500 implementing the circuit of FIG. 4.
Figure 6:
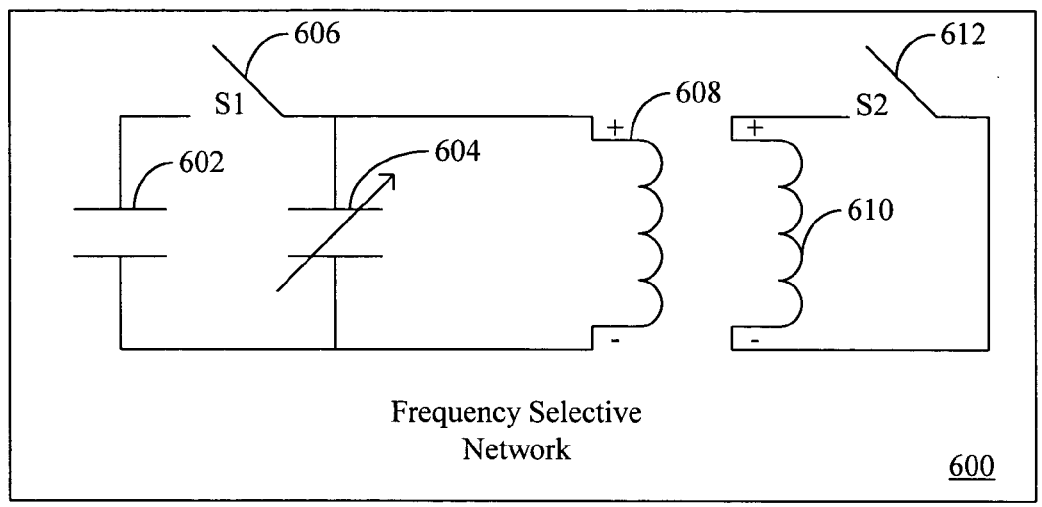
FIG. 6 illustrates a circuit diagram of an RF VCO structure 600.

Turning to FIG. 6, that figure illustrates a circuit diagram for an RF voltage controlled oscillator (VCO) 600. The RF VCO may include a capacitor 602 connected in parallel with a varactor 604 by switch S1 606. The varactor 604 is connected in parallel to inductor 608. A mutually coupled inductor 610 is switched into the RF VCO circuit by switch S2 612. The switched-in mutually-coupled inductor 610 results in a band shift up in tuning range, while the switching in of capacitor 602 results in a shifting down of the tuning range.

An advantage of using the single inductive shift (i.e., the mutually-coupled inductor 610) is that the space in a semiconductor chip adjacent to the primary inductor or underneath the primary conductor in a multi-level metal layering process may be employed for the mutually conductive inductor. The placement of the mutually-conductive inductor results in a common area formed by the inductor and the mutually-conductive inductor. Such an area may then be used for the additional electrical components of the RF VCO circuit in the semiconductor chip. By making use of the common area for the RF VCO circuitry, fewer contacts between the RF VCO circuitry are required and more efficient use of space within the semiconductor chip is achieved. Further, the single capacitive shift minimizes the tuning range reduction due to fixed low-end capacitance caused by components on the semiconductor chip. Thus, the area increase of the current approach may be as little as 1.1 times the area of the inductors compared to a three times area requirement for implementing a traditional approach.

Figure 7:
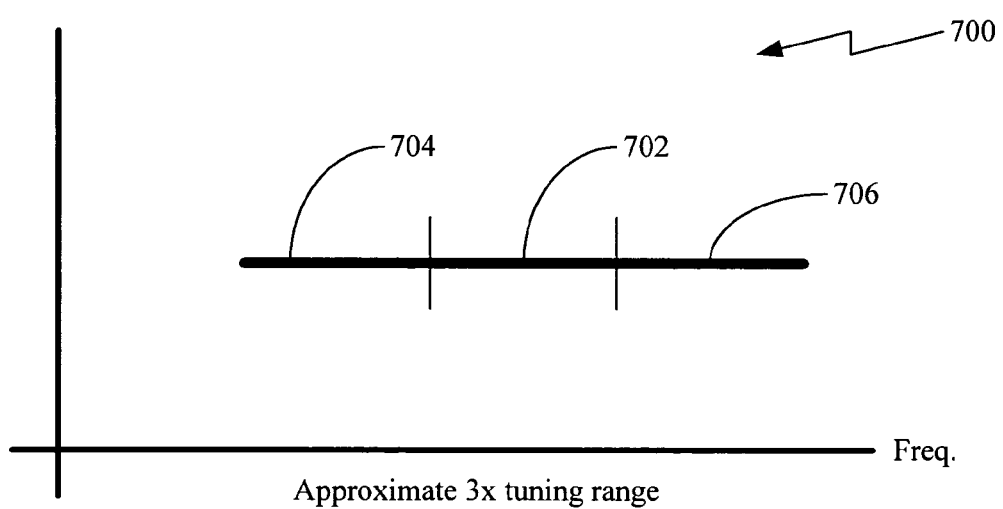
FIG. 7 illustrates an approximate 3×tuning range 700 of the circuit of FIG. 6.

In FIG. 7, an approximate 3× tuning range 700 of the circuit of FIG. 6 is shown. The varactor 604 and inductor 608 result in the mid-tuning range 702. When capacitor 602 is switched into the circuit, the tuning band shifts down 704. Similarly when the mutually-coupled inductor 610 is switched into the circuit and the capacitor 602 is switched out and the tuning band shifts up 706. The capacitor 602 and mutually-coupled inductor 610 are typically not switched in at the same time. In other implementations, only capacitors or inductors may be configured to switched into and out of the circuit rather than both capacitors and inductors.

The circuit of FIG. 6 may be implemented in semiconductor material such as CMOS, GaAs, BiCMOS to name but a few examples. To achieve the 3× band shift, both a capacitor and inductor are used to shift the band resulting in a circuit that has at least two inductors being formed within the semiconductor material. The at least two inductors are formed within the semiconductor material so they enclose a common area of semiconductor material. That common area of semiconductor material is then able to have electrical components formed on that area. If capacitors, switches, and/or varactor are formed within that common area, then the number of interconnections is reduced between the inductors and other electronic components that form the RF VCO. The reduction in interconnections is achieved as a result of the common area being a central location for the electronic components needed to implement the VCO.

Figure 8:
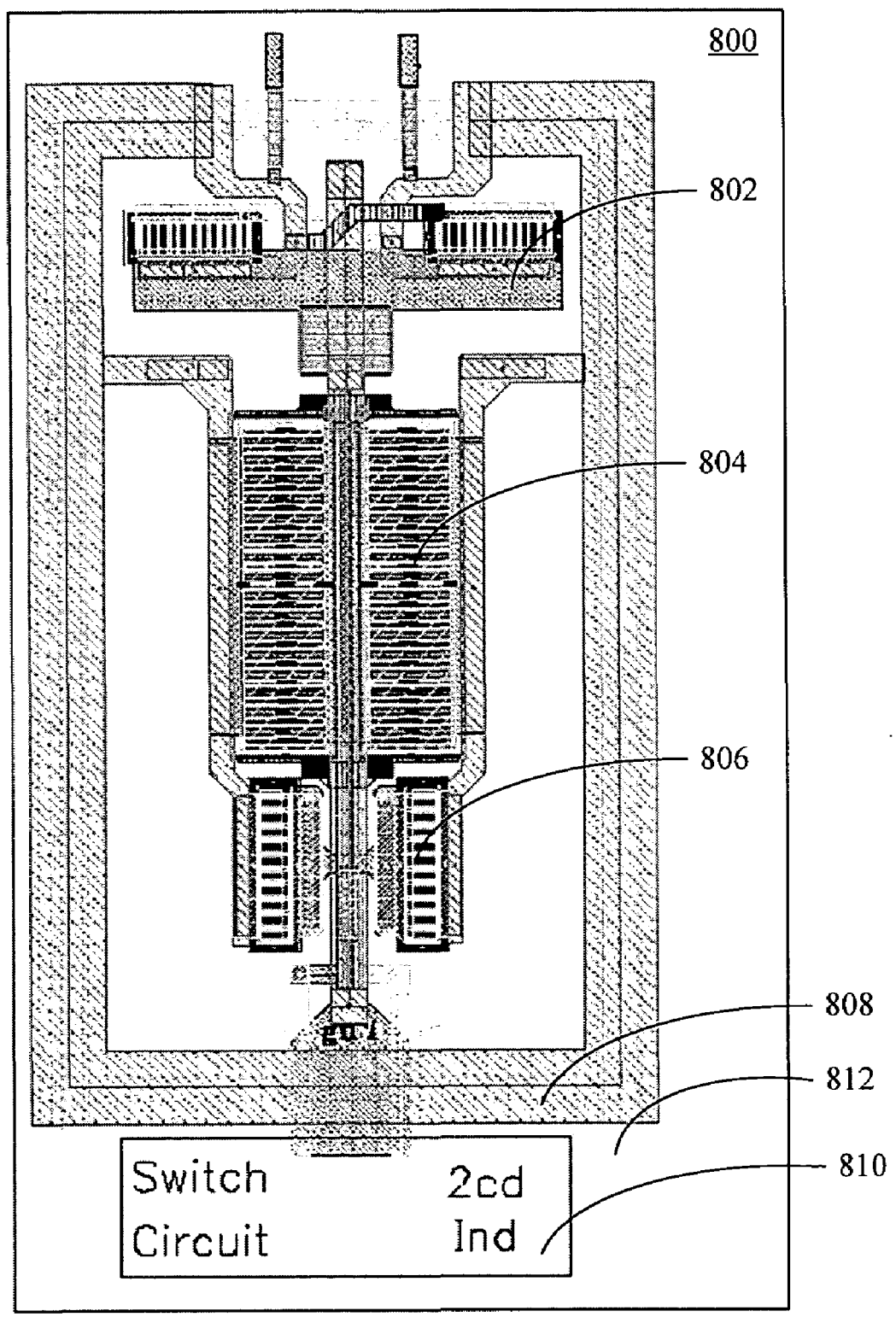
FIG. 8 illustrates the RF VCO structure of FIG. 6 implemented in BiCMOS 800.

Turning to FIG. 8, an illustration 800 of the RF VCO structure of FIG. 6 implemented in BiCMOS is shown. A plurality of electronic components are shown, including an oscillator circuit 802 connected to a varactor circuit 804 and a capacitor circuit 806. The oscillator circuit 802, varactor circuit 804 and capacitor circuit 806 lie within the common area formed by the metal of inductor 808 and mutually coupled inductor 812. A switch circuit 810 switches the mutually coupled inductor 812 in and out of the circuit. The mutually coupled inductor 812 is shown as being under the inductor 808 and sharing a common area, but in other implementations the mutually-coupled inductor may be beside, below, or offset from inductor 808 as long as a common area is formed by the two inductors. The RF VCO structure 800 with the common area defined by the two inductors being used requires less die area in a semiconductor chip compared to the previous known implementations while achieving approximately three times tuning band with minimal performance degradation.

Figure 9:
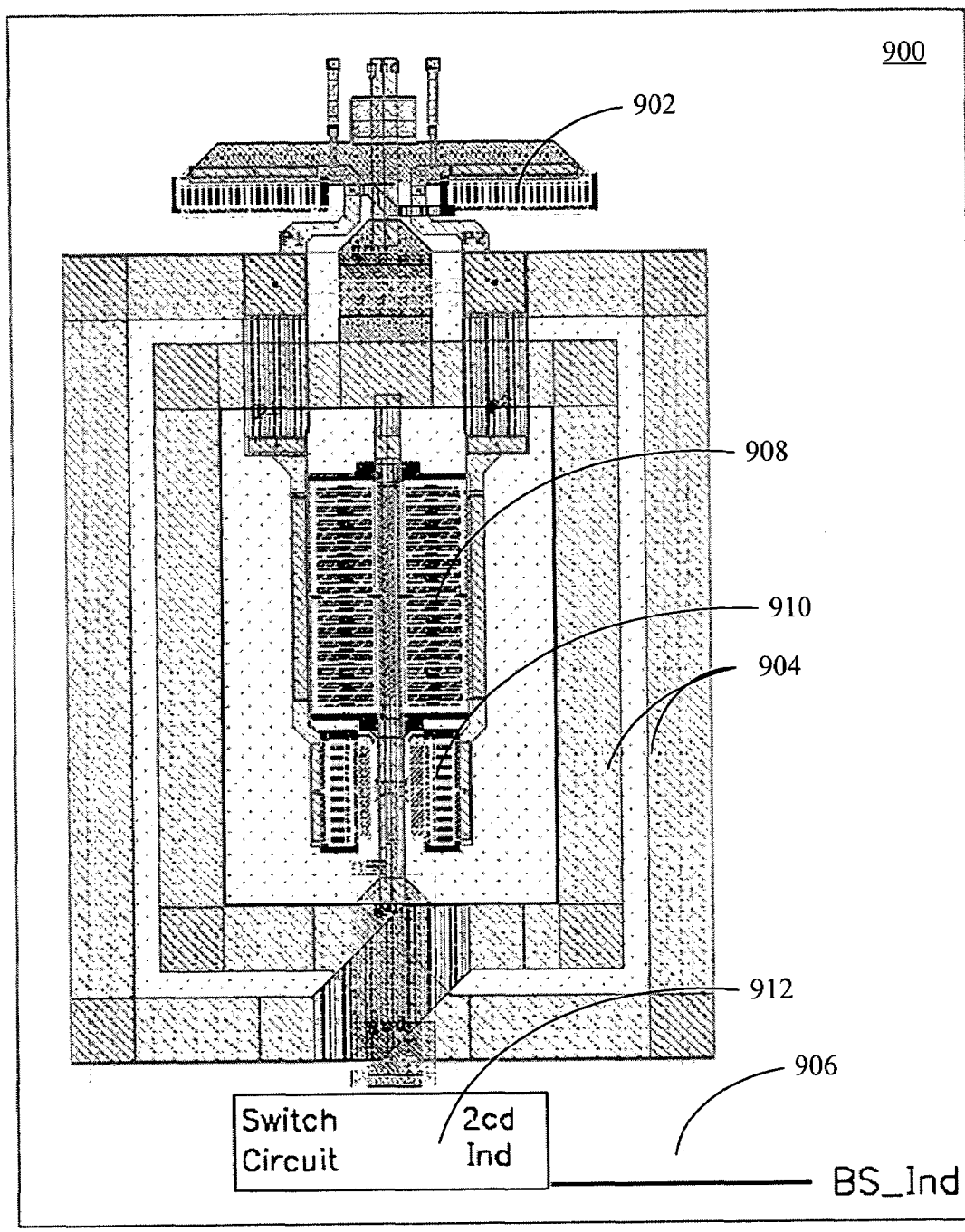
FIG. 9 illustrates another RF VCO structure in BiCMOS 900.

In FIG. 9, another illustration of the RF VCO structure 900 in BiCMOS is shown. The oscillator circuit 902 is shown outside the common area defined by the metal layers of the inductor 904 and mutually coupled inductor 906. The varactor circuit 908 and capacitor circuit 910 are placed within the metal that form inductor 904 and mutually coupled inductor 906. The switch circuit 912 controls the switching in of the capacitor circuit 910 and mutually-coupled inductor 906. Thus, one of the advantages of the RF VCO structure 900 is the use of the common area formed on the interior of the inductor 904 and mutually-coupled inductor 906 while reducing the number of interconnects required in a VCO. Even though the circuit is implemented as a BiCMOS semiconductor chip, other types of semiconductor manufacturing materials may be employed. Examples of other methods include CMOS, Gallium Arsenide (GaAs), FET, and BJT to name but a few methods.

Figure 10:
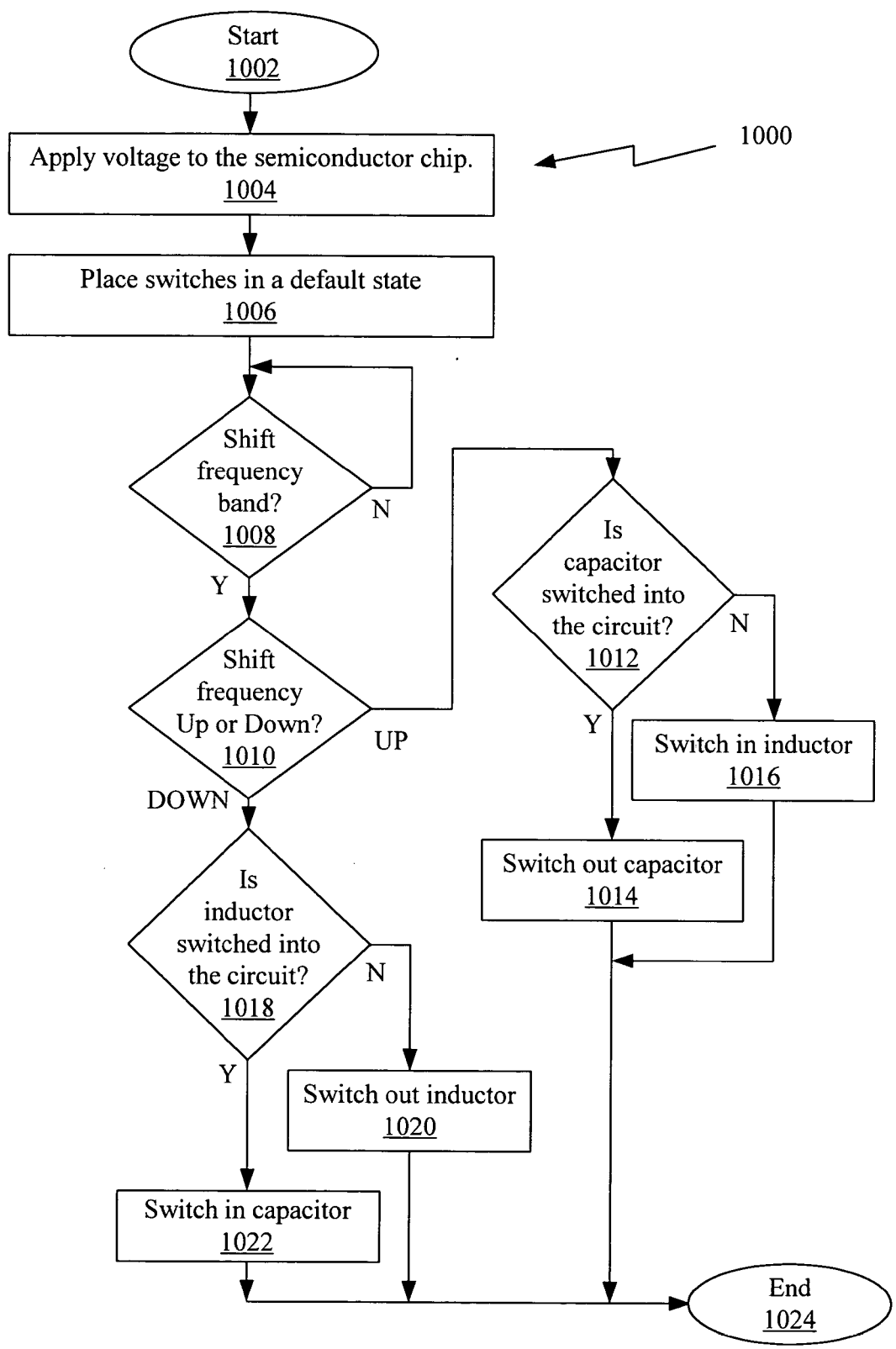
FIG. 10 is a flow diagram 1000 of the 3× band shifting operation of the RF VCO of FIG. 9.

FIG. 10 is a flow diagram 1000 of the 3× band shifting operation of the RF VCO of FIG. 9. The semiconductor material of FIG. 9 is commonly called a semiconductor chip or integrated circuit. The flow diagram 1000 starts 1002 when an external voltage is applied to the semiconductor chip 1004. The switches in switch circuit 912 are set to a default state 1006 so the mutually-coupled inductor 906 and the capacitor circuit 910 are not switched into the RF VCO structure 900. If a shift in the frequency band of the VCO is needed 1008, then the type of shift (up or down) is determined 1010. Otherwise, another check is conducted to see if a shift in the frequency band of the VCO is needed 1008.

If a frequency shift up of the frequency band is needed 1010, then it is determined 1012 if the capacitor circuit 910 is switched into the VCO structure 900. If the capacitor circuit 910 is switched into the VCO structure 900 already, a frequency band shift up in frequency is achieved by switching the capacitor circuit out of the VCO structure 900 in step 1014. Otherwise, a frequency band shift up in frequency is achieved by closing the switch 1016 that switches in the mutually conductive inductor 906 in parallel with inductor 904. Processing is shown as ending at step 1024, but in most implementations the flow would repeat step 1008.

If a frequency band is needed to shift down to a low frequency 1010, then a determination is made 1018 if a mutually-conductive inductor 906 has been switched in parallel with inductor 904. If the mutually-conductive inductor 906 is in parallel with inductor 904 in step 1018, then the mutually-conductive inductor 906 is switched out of the VCO structure 900 in step 1020. If the mutually-conductive inductor 906 is not switched into the VCO structure 900 instep 1018, then the capacitor circuit 910 is switched in parallel with the varactor circuit 908 of the VCO structure 900 in step 1022. By switching in the capacitor circuit in parallel with the varactor circuit 908, a shift down in the frequency band is achieved. The flow diagram 1000 is shown ending 1024, but in practice the flow would repeat starting at step 1008 as long as electrical power is supplied to the semiconductor chip.

Figure 11:
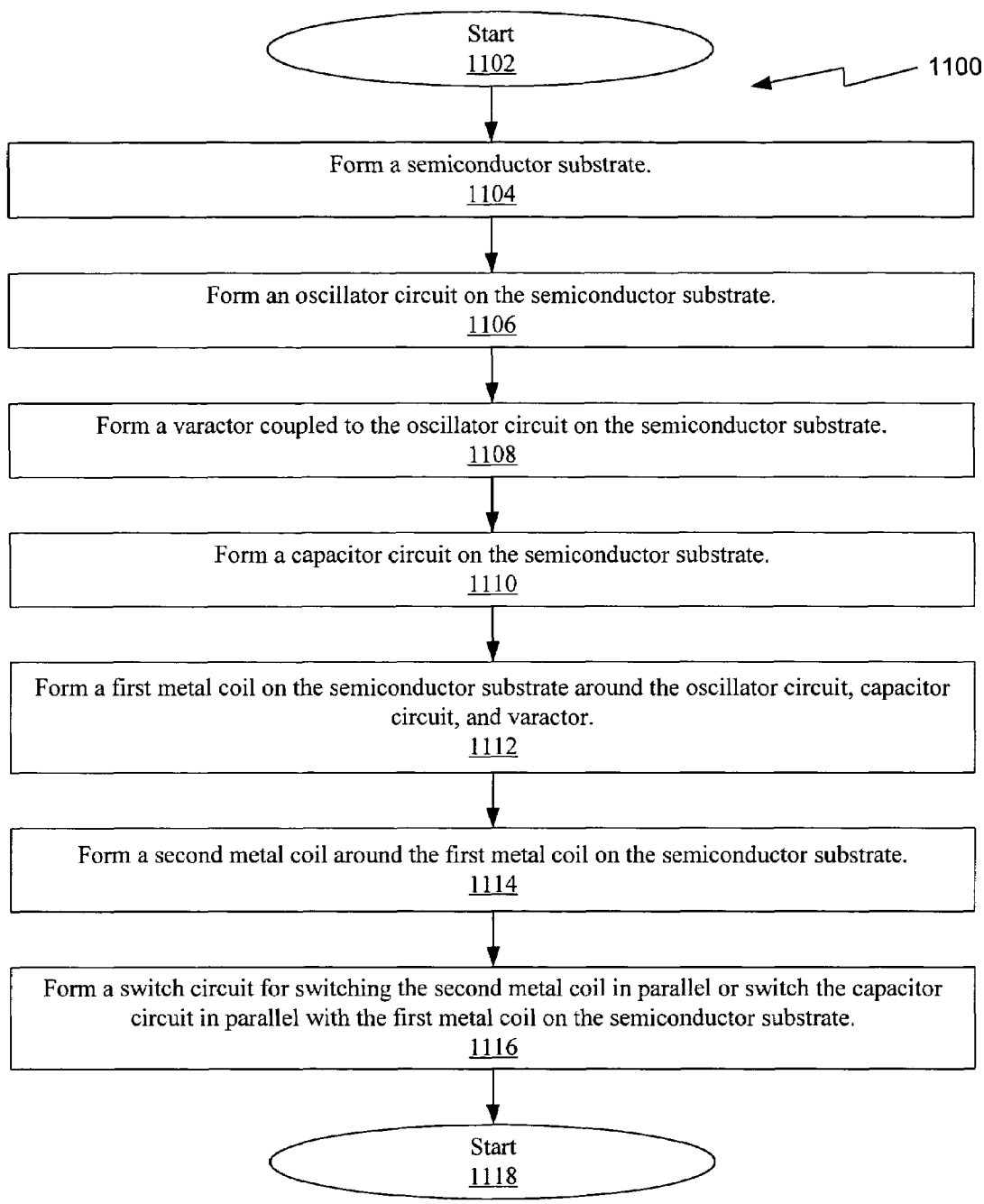
FIG. 11 illustrates a flow diagram 1100 of the procedure for forming the RF VCO structure of FIG. 6.

Turning to FIG. 11, a flow diagram 1100 of the procedure for forming the RF VCO structure of FIG. 6 is shown. The procedure starts 1102 by formation of a semiconductor substrate 1104. Upon the substrate an oscillator circuit 1106 is formed. The oscillator circuit is formed with connections to a varactor that is formed on the substrate 1108. A capacitor circuit is formed on the substrate 1110 and coupled with the varactor. A first metal coil is formed 1112 on the substrate around the oscillator circuit, varactor circuit and capacitor circuit. A second metal coil is formed around the first metal coil 1114 and results in a common area within both metal coils 1112 and 1114. In an alternate embodiment, the second metal coil may be formed below or below and partially offset from the first metal coil. A switch circuit is formed on the substrate 1116 and is able to switch in the capacitor circuit and the second metal coil (mutually coupled inductor). The procedure is complete 1118 and a RF VCO structure has been created with approximately 3× tuning range. In other implementations, other electronic components in addition to or instead of at least one of the capacitor circuit, oscillator circuit, varactor, or the switch circuit may be formed in the common area enclosed by at least two metal coils of the two inductors.

The foregoing description of an implementation has been presented for purposes of illustration and description. It is not exhaustive and does not limit the claimed inventions to the precise form disclosed. Modifications and variations are possible in light of the above description or may be acquired from practicing the invention. For example, the described implementation includes software but the invention may be implemented as a combination of hardware and software or in hardware alone. Note also that the implementation may vary between systems. The claims and their equivalents define the scope of the invention.

What is claimed is:

1. A semiconductor having a plurality of electrical components, comprising:
    a varactor;
    an inductor coupled to the varactor;
    a switch; and
    another inductor that is switched in parallel with the inductor by the switch and that forms a common area in the semiconductor enclosed by both the inductor and the other inductor with at least one of the varactor and the switch located in the common area.

2. The semiconductor of claim 1, further includes:
    an at least one capacitor; and
    another switch that switches the at least one capacitor in parallel with the varactor.

3. The semiconductor of claim 2, where the at least one capacitor is in the common area.

4. The semiconductor of claim 1, where the inductor and the other inductor that form the common area are offset in at least one of three dimensions from each other.

5. A VCO Structure, comprising:
    a plurality of electronic components in a semiconductor material; and
    an at least two inductors in the semiconductor material that form a common area that encloses at least one of the plurality of electrical components.

6. The VCO structure of claim 5, where one of the at least two inductors is offset in at least one of three dimensions from the other of the at least two inductors.

7. The VCO Structure, of claim 5, where one of the plurality of electrical components is a varactor.

8. The VCO structure of claim 7, where the plurality of electrical components further include:
    an at least one tuning element that shifts the tuning band of the VCO; and
    an at least one switch that results in the tuning element being electrically in parallel with one of the at least two inductors.

9. The VCO structure of claim 8, where the at least one tuning element is a capacitor.

10. The VCO structure of claim 8 including:
    an at least one capacitor; and
    another switch that switches in the at least one capacitor in parallel with the one inductor of the at least two inductors.

11. The VCO structure of claim 5, where the VCO structure is formed in BiCMOS.

12. A method for forming a VCO Structure, comprising:
forming a plurality of electrical components upon a substrate; and
forming an at least two inductors so that they enclose a common area and at least one of the plurality of electrical components is located in the common area.

13. The method of claim 12, where the at least one of the plurality of electrical components is a varactor.

14. The method of claim 12, further includes:
offsetting one of the at least two inductors in at least one of three dimensions from the other inductor.

15. The method of claim 12, including:
forming an at least one tuning element upon the substrate that shifts the tuning band associated with the VCO structure; and
forming an at least one switch that results in the tuning element being electrically in parallel with at least one of the at least two inductors.

16. The method of claim 15, where the forming an at least one tuning element is forming a capacitor.

17. The method of claim 15, including:
forming an at least one capacitor upon the substrate; and
forming another switch that switches in the at least one capacitor in parallel with the at least one inductor of the at least two inductors.

18. A VCO method, comprising:
determining that a frequency band shift is needed;
switching an inductor in parallel with another inductor where the inductor and other inductor form a common area on a semiconductor that contains an electrical component.

19. The VCO method of claim 18, further includes:
switching a capacitor in parallel with a varactor when the inductor is not switched in parallel with the other inductor.

20. The method of claim 19, where the capacitor is located in the common area.

21. The method of claim 19, where the varactor is located in the common area.

* * * * *